US012322714B2

(12) United States Patent
Buckwalter et al.

(10) Patent No.: US 12,322,714 B2
(45) Date of Patent: *Jun. 3, 2025

(54) HETEROGENEOUS INTEGRATION OF RADIO FREQUENCY TRANSISTOR CHIPLETS HAVING INTERCONNECTION TUNING CIRCUITS

(71) Applicant: PseudolithIC, Inc., Santa Barbara, CA (US)

(72) Inventors: James Buckwalter, Santa Barbara, CA (US); Michael Hodge, Huntersville, NC (US); Justin Kim, San Jose, CA (US); Florian Herrault, Agoura Hills, CA (US); Daniel Green, McLean, VA (US)

(73) Assignee: PseudolithIC, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/491,661

(22) Filed: Oct. 20, 2023

(65) Prior Publication Data
US 2024/0413103 A1   Dec. 12, 2024

Related U.S. Application Data

(63) Continuation of application No. 18/182,314, filed on Mar. 10, 2023, now Pat. No. 11,810,876.

(51) Int. Cl.
*H01L 23/66* (2006.01)
*H03H 7/38* (2006.01)

(52) U.S. Cl.
CPC .............. *H01L 23/66* (2013.01); *H03H 7/38* (2013.01); *H01L 2223/6605* (2013.01); *H01L 2223/6661* (2013.01)

(58) Field of Classification Search
None
See application file for complete search history.

(56) References Cited

U.S. PATENT DOCUMENTS

| | | | |
|---|---|---|---|
| 8,617,927 B1 | 12/2013 | Margomenos et al. |
| 9,214,404 B1 | 12/2015 | Margomenos et al. |
| 9,385,083 B1 | 7/2016 | Herrault et al. |
| 9,837,372 B1 | 12/2017 | Herrault et al. |
| 10,026,672 B1 | 7/2018 | Herrault et al. |

(Continued)

FOREIGN PATENT DOCUMENTS

EP    3133735 A1    2/2017

OTHER PUBLICATIONS

World Intellectual Property Organization, International Search Report for International Application No. PCT/US2024/014897, mail date Jul. 2, 2024, 17 total pages.

*Primary Examiner* — Hung K Vu
(74) *Attorney, Agent, or Firm* — SoCal IP Law Group LLP; Angelo J. Gaz; Steven C. Sereboff

(57) ABSTRACT

An electronic assembly has a host wafer having a first circuit including passive devices for the purpose of one of tuning or matching networks. Chiplets are placed in the cavities. At least one chiplet has a second circuit including at least one transistor or switch device and passive tuning circuits including at least one of a stabilization network, a gain boosting network, a power delivery network, or a low-noise network. Electrical interconnects between the chiplets and wafer electrically connect the first circuitry to the second circuitry.

18 Claims, 11 Drawing Sheets

©2023 PseudolithIC, Inc.

(56) References Cited

U.S. PATENT DOCUMENTS

| | | |
|---|---|---|
| 10,079,160 B1 | 9/2018 | Margomenos et al. |
| 10,483,184 B1 | 11/2019 | Herrault et al. |
| 10,957,537 B2 | 3/2021 | Herrault |
| 10,998,273 B2 | 5/2021 | Herrault et al. |
| 11,158,520 B2 | 10/2021 | Herrault |
| 11,810,876 B1 * | 11/2023 | Buckwalter .............. H03H 7/38 |
| 2009/0256253 A1 * | 10/2009 | Preda ...................... H01L 23/50 |
| | | 716/136 |
| 2010/0246153 A1 | 9/2010 | Buer |
| 2011/0057302 A1 * | 3/2011 | Spehar ................... H01L 23/66 |
| | | 257/784 |
| 2013/0307635 A1 | 11/2013 | Kase et al. |
| 2020/0144977 A1 | 5/2020 | Yu et al. |
| 2021/0159179 A1 * | 5/2021 | Elsherbini ........... H01L 21/4846 |
| 2022/0237337 A1 | 7/2022 | Halim et al. |
| 2022/0399856 A1 | 12/2022 | Yang et al. |

\* cited by examiner

HETEROGENEOUS INTEGRATION OF RADIO FREQUENCY TRANSISTOR CHIPLETS HAVING INTERCONNECTION TUNING CIRCUITS

RELATED APPLICATION INFORMATION

The present application is a continuation of co-pending patent application Ser. No. 18/182,314, filed Mar. 10, 2023 entitled HETEROGENEOUS INTEGRATION OF RADIO FREQUENCY TRANSISTOR CHIPLETS HAVING INTERCONNECTION TUNING CIRCUITS, of which is incorporated herein by reference.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to a host wafer having circuitry and radio frequencies (RF) transistor chips (or chiplets) within cavities of the wafer, the chips including network circuitry for tuning electrical interconnections between the chips and the wafer.

Description of the Related Art

Electronic assemblies, or hybrid circuits, comprise microelectronic circuits fabricated separately and assembled together to form a single component, which can itself be encapsulated in an electronic circuit package. Assembling microelectronic circuits fabricated separately allows, for example, testing of all the microelectronic circuits separately, prior to assembling them, which, in turn enables improved fabrication yields of the final component. This capability is particularly significant if some of the microelectronic circuits fabricated separately are difficult and/or expensive to manufacture. Assembling microelectronic circuits fabricated separately also allows combining of microelectronic circuits, which themselves employ different materials and different manufacturing processes, into a single final component. This capability can lead to higher circuit performance.

There exists a need for an electronic assembly using a host wafer having pre-fabricated integrated circuitry, such as passive components, that connect to a microelectronics active chiplet (i.e., with transistors) integrated in a through-wafer cavity of the host wafer. This need may for example be for an assembly for microwave or other radio frequency (RF) integrated circuits that decouple the fabrication of the active circuits (e.g., fabrication of the transistors) from the fabrication of the passive circuitry components (e.g., fabrication of the interconnects, resistors and capacitors). Satisfying this need will allow for much faster manufacturing of the circuits, at lower cost, and a scaling up of active device technologies to circuits without cost and cycle time burden.

Figure 1A:
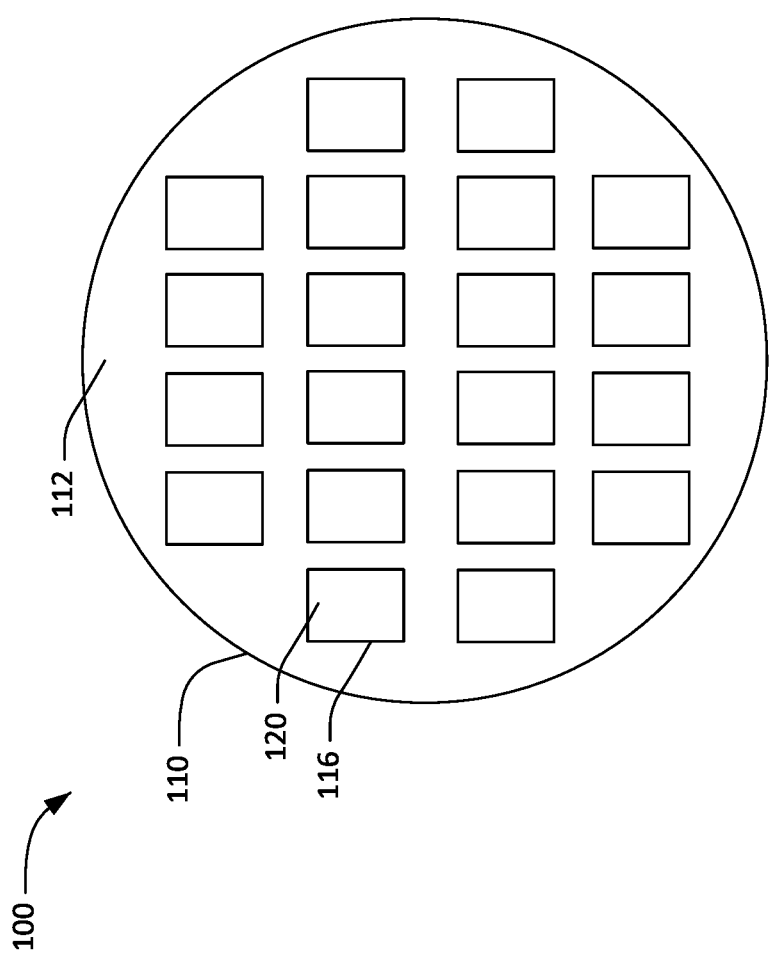
FIG. 1A is a schematic top view of a host wafer for heterogeneous integration of radio frequencies (RF) transistor chiplets with tuning circuitry for matching of impedances.

Throughout this description, elements appearing in figures are assigned three-digit or four-digit reference designators, where the two least significant digits are specific to the element and the one or two most significant digit may be the figure number where the element is first introduced or fabricated. An element that is not described in conjunction with a figure may be presumed to have the same characteristics and function as a previously-described or subsequently-described element having the same reference designator.

DETAILED DESCRIPTION

Description of Apparatus

The following describes improved wafers, die, chips and fabrication techniques thereof for electronic assemblies having heterogeneous integration of radio frequencies (RF) transistor chips (e.g., chiplets) having interconnection tuning circuits between the wafer and the chips. The host wafer has circuitry and the radio frequencies (RF) transistor chips within cavities of the wafer, and the chips include one or more types of network circuitry that tune the electrical interconnections between the chips and the wafer. The host wafer can have pre-fabricated interconnects and integrated circuitry, such as passive components, that connect to a chiplet level microelectronics transistor chip integrated in a through-wafer cavity of the wafer. This may form an assembly for integrated circuit devices where the chips contain active circuits from at least one semiconductor technology and the wafers contain passive (or active) circuits from another semiconductor technology (often a cheaper and larger scale technology). Using a low-cost large-diameter integration platform for the chips with active devices allows for much faster manufacturing of the assembled circuits, at larger scale and lower cost.

The electronic assembled circuit may integrate chiplets having one type of components into a carrier wafer having a different type of components. The electronic assembled circuit may integrate chiplets having high-performance integrated circuits, such as Gallium Nitride (GaN) radio frequency (RF) integrated circuits (ICs) into host wafers having other integrated circuits, such as silicon-based integrated circuits, in a manner that is inexpensive and has high manufacturing yields and short manufacturing cycles. The high performance RF ICs, chips (or chiplets) can have type III-V transistors or other types of transistors and passive circuitry or components, and can be integrated together with resistors, inductors, capacitors and matching networks, as well as active devices from another semiconductor technology into the host wafer. For example, the RF ICs or chiplets can be one type of semiconductor technology that is integrated together with resistors, inductors, capacitors, matching networks, active devices from another semiconductor technology that are part of the host wafer.

A chiplet may be a chip including the circuitry, material, and/or devices noted herein. It may also be a chip or small chip having active (i.e., transistor) microelectronic devices, active CMOS devices, active microwave IC devices and/or active radio frequency (RF) IC devices. It may also be a chip or small chip having a surface acoustic wave (SAW), bulk acoustic wave (BAW) or other acoustic wave device. A chiplet may have a footprint or top surface area that is half, a third, a fifth or less than a fifth of that of a computer processor chip (e.g., 8086, P3, P4, etc.). Active devices may include active electronic components and/or active electronic circuits.

The interconnect between the chiplet and wafer may be mistuned, such as by having AC (alternating current) signal frequencies different at the wafer as compared to the chiplet. The interconnect between the chiplet and wafer may be mismatched such as by having impedance differences at the wafer as compared to the chiplet that cause instability in AC signals, DC (direct current) signals and/or other electronic signal matching with the input and/or output to the chiplet or a transistor on the chiplet. This lack of tuning may be improved or tuned using the tuning circuits or networks herein.

Figure 3A:
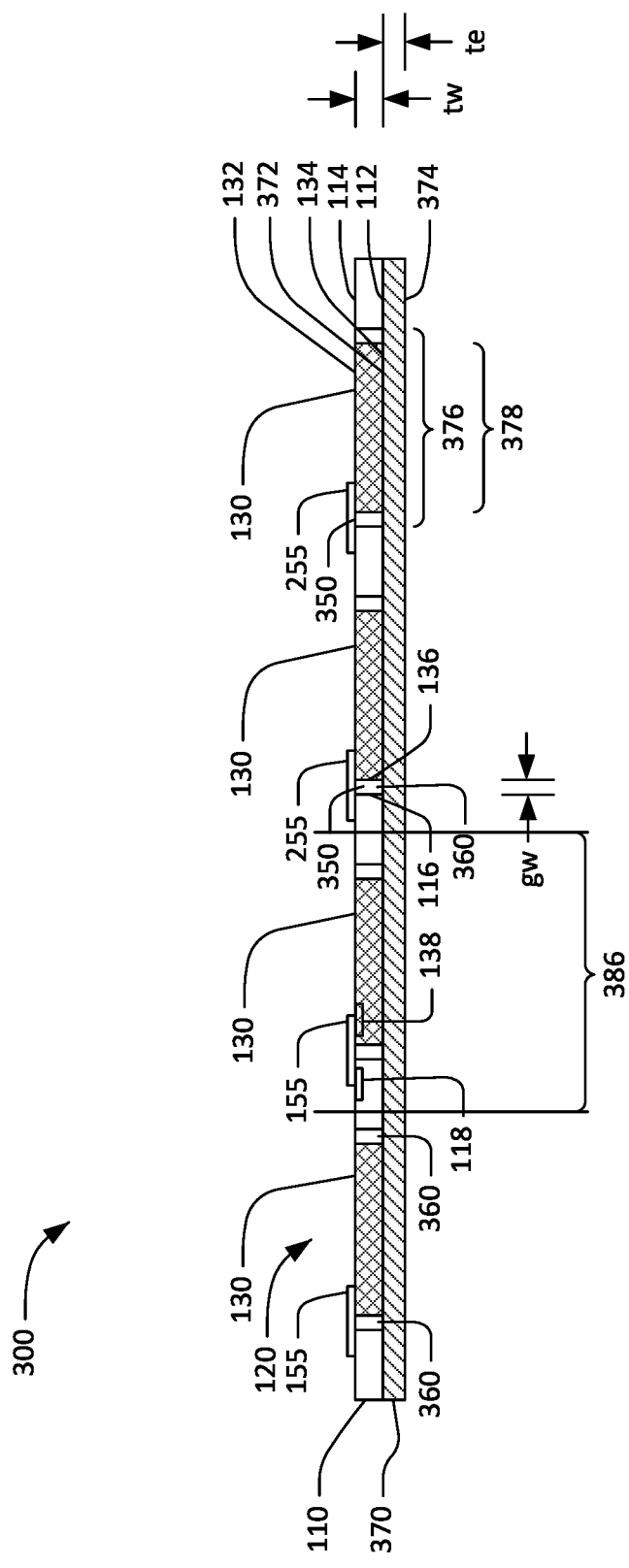
FIG. 3A is a schematic cross-sectional view of a device having heterogeneous integration of a radio frequencies (RF) transistor chiplets into a wafer, where the chiplets have interconnection tuning circuits.
Figure 3B:
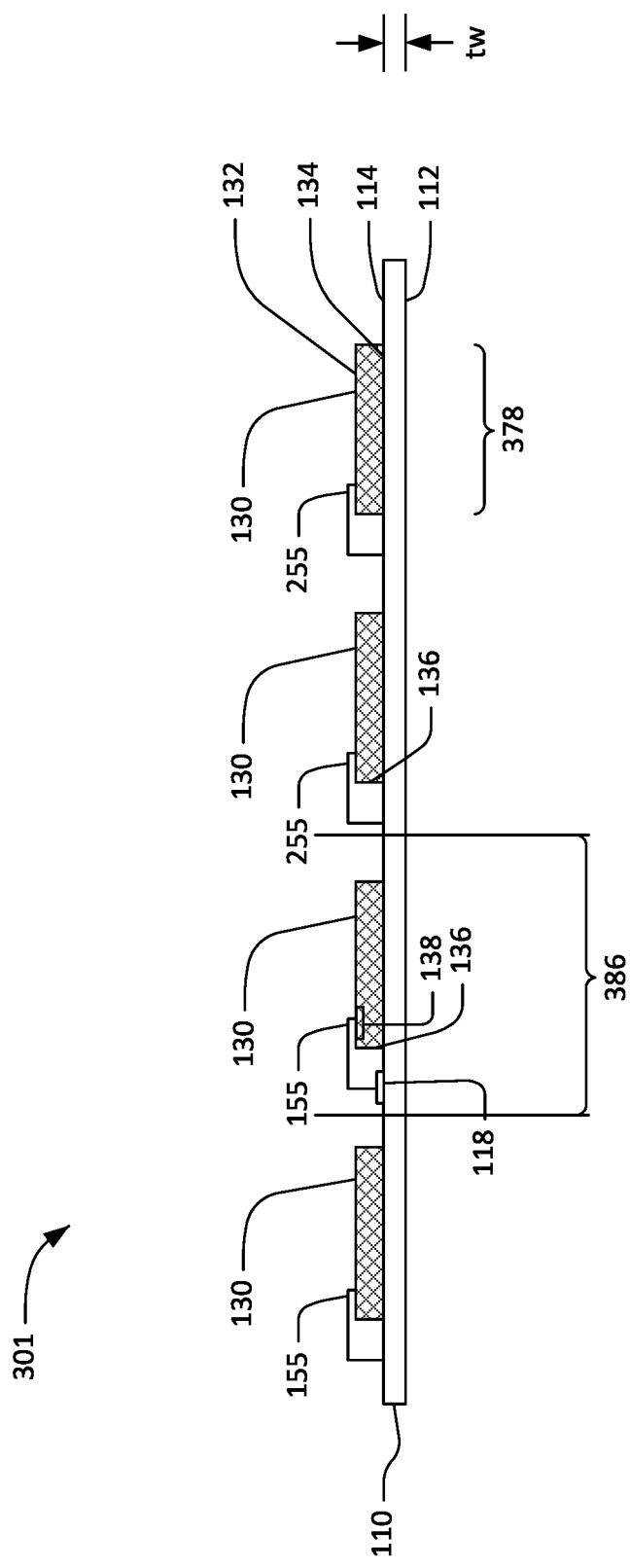
FIG. 3B is a schematic cross-sectional view of a device having heterogeneous integration of a radio frequencies (RF) transistor chiplets onto a wafer, where the chiplets have interconnection tuning circuits.

FIG. 1A is a schematic top view 100 of a host wafer 110 for heterogeneous integration of radio frequencies (RF) transistor chiplets with tuning circuitry for matching of impedances. Host wafer 110 has back surface 112 and front surface 114 as shown in FIGS. 3A and 3B. Host wafer 110 and/or each cavity 120 has side surfaces 116, such as a vertical or sidewall surfaces between the back surface 112 and front surface 114. There may be 3, 4 or more side surface 116. Typically, there are 4 side surfaces. Wafer capacitors, inductors and resistors may be tuning circuitry for matching of impedances of the interconnects from the chiplet (e.g., see FIG. 1C).

Host wafer 110 may be or include (e.g., as a mixture of materials or as material layers) silicon, silicon germanium, silicon on insulator, gallium arsenide, indium phosphide, aluminum nitride, diamond, quartz, alumina. If the host wafer 110 only contains interconnections and passive components, it can be a dielectric such as quartz, alumina, or another ceramic. The host wafer 110 may have layers of one or more of these materials in the form of an oxide material, crystalline material and polycrystalline material and/or amorphous material. Host wafer 110 may include some or only passive components such as resistors, capacitors, inductors, through substrate vias, dielectric layers, and/or metal layers (e.g., signal traces or signal planes). Host wafer 110 may include at least one layer of silicon, silicon carbide (SiC), quartz, or another semiconductor wafer material.

Host wafer 110 may include areas to be diced into integrated circuits, each having passive integrated components (e.g., signal traces, interconnects and conductive vias, resistors, inductors and/or capacitors), a single transistor and/or a plurality of transistors. Silicon is an advantageous choice for host wafer 110, because it takes advantage of having a lower expense than other materials; and/or of known microelectronics fabrication processes and of scaling and manufacturing capabilities.

Figure 1B:
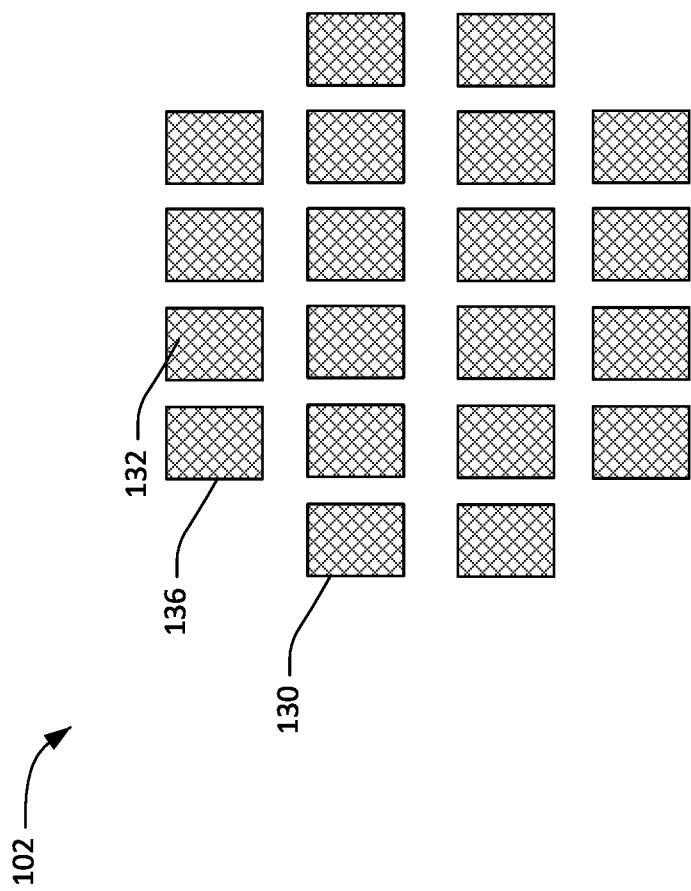
FIG. 1B is a schematic top view of radio frequencies (RF) transistor chiplets having interconnection tuning circuits for heterogeneous integration into wafer cavities of a host wafer.

FIG. 1B is a schematic top view 102 of radio frequencies (RF) transistor chiplets 130 having interconnection tuning circuits for heterogeneous integration into wafer cavities 120 of host wafer 110. Chiplets 130 have frontside 132 (e.g., a frontside surface) and backside 134 (e.g., a backside surface) as shown in FIGS. 3A and 3B. Each chiplet 130 has side surfaces 136, such as a vertical or sidewall surfaces between the frontside surface 132 and backside 134. There may be 3, 4 or more side surface 136. Typically there are 4 side surfaces. The number of side surfaces 136 of each chiplet 130 may be the same as the number of surfaces 116 of the cavities in the host wafer 110. Chiplets 130 may each include circuitry described for FIGS. 1C-3B.

Chiplets 130 may each be or include (e.g., as a mixture of materials or as material layers) silicon (Si), silicon germanium (SiGe), silicon-on-insulator, gallium arsenide (GaAs), indium phosphide (InP), aluminum nitride, quartz, alumina, gallium nitride (GaN). The chiplets 130 may have layers of one or more of these materials in the form of an oxide material, crystalline material and polycrystalline material and/or amorphous material. There may be different electrical component ones or types of chiplets 130 that are manufactured separately from each other. Chiplets 130 can include a GaN, InP or GaAs or any other industry-known electrical component and can be fabricated on a substrate such as Si, SiGe, InP, GaAs, Alumina, or diamond, or any other substrate known in the industry.

Chiplets 130 or types of chiplets 130 may include transistors used for RF switches, transmit and/or receive circuits; power switches, amplifiers and circuits such as using GaAs, InP, GaN while the host wafer may include transistors such as Si CMOS transistors. The chiplet transistors may have smaller and more expensive electrical components than those of host wafer 110. There may be one, tens, hundreds, thousands or hundreds of thousands of chiplets 130 embedded in or on one host wafer 110. There may be between one and one hundred chiplets 130 embedded in one host wafer 110. Host wafer 110 may have more passive components, lower cost components, routing (e.g., traces, conductive vias and interconnections) than those of chiplets 130. Host wafer 110 may be fabricated using different microelectronic fabrication techniques or processes than used to fabricate chiplets 130.

Chiplets 130 and host wafer 110 can be made of different materials. For example, wafer 110 can be a silicon wafer while chiplets 130 can be a type III-Nitride material component chip. Chiplets 130 may each be or include an integrated circuit having passive integrated components (e.g., signal traces, interconnects and conductive vias, resistors, inductors and/or capacitors), a single transistor and/or a plurality of transistors.

The chiplets 130, each include at least one of transistor circuitry and interconnects to contact pads on a frontside 132 of the chiplets 130. The chiplets 130 may be high-end pre-fabricated active device chiplets that are integrated into host wafer 110 through pick and place assembly on temporary wafer with an adhesive laminate or simply on an adhesive laminate.

Figure 1C:
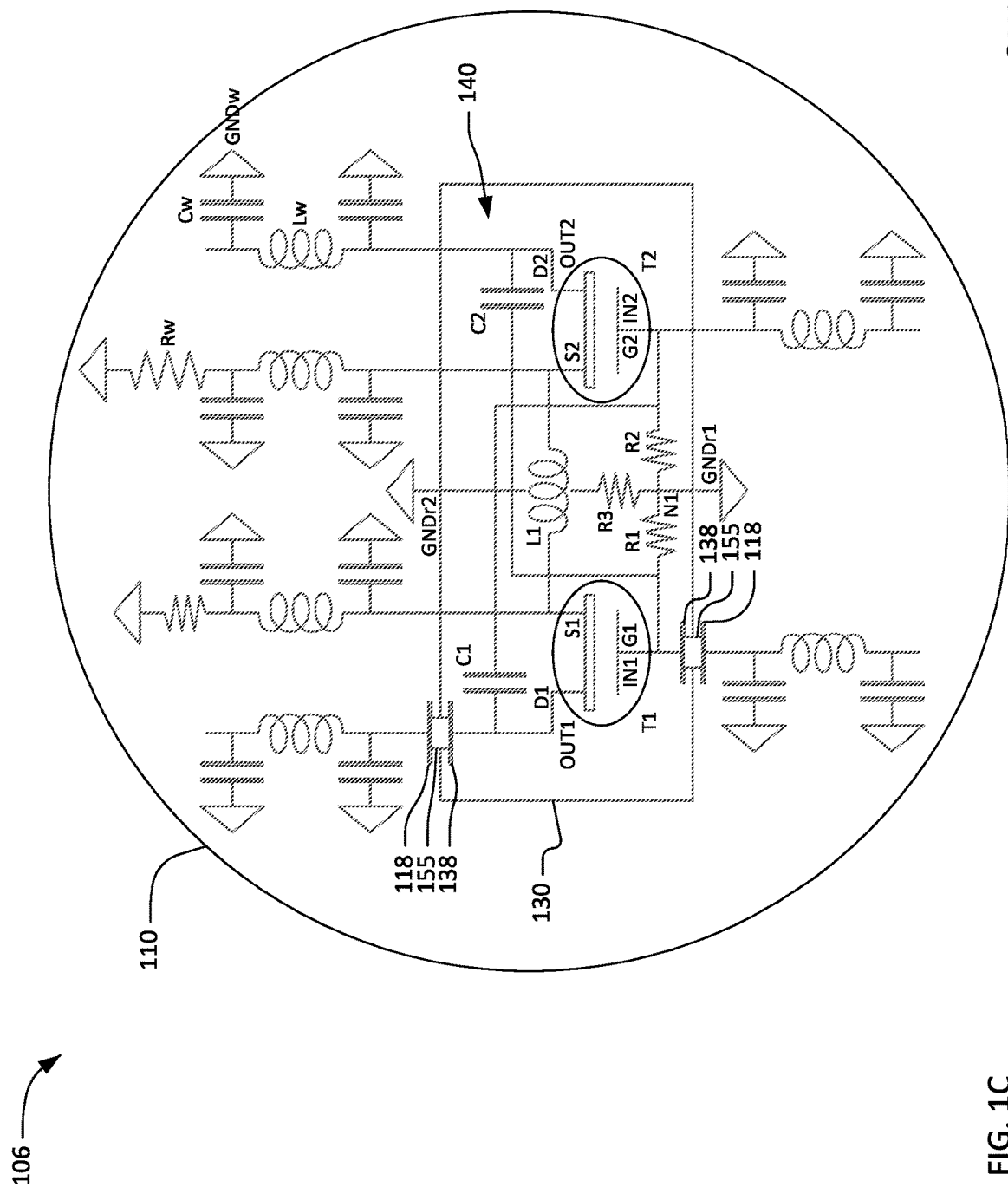
FIG. 1C is a circuit diagram of an electronic assembly having heterogeneous integration of a radio frequencies (RF) transistor chiplet into a wafer, where the chiplet has interconnection tuning circuits.

FIG. 1C is a schematic circuit diagram of an electronic assembly 106 having heterogeneous integration of radio frequencies (RF) transistor chiplet 130 into host wafer 110, where the chiplet 130 has interconnection tuning circuits 140 having passive circuitry. Wafer 110 includes resistors as shown by their schematic symbol one of which is labeled Rw, capacitors as shown by their schematic symbol one of which is labeled Cw, inductors as shown by their schematic symbol one of which is labeled Lw, and grounding as shown by their schematic symbol one of which is labeled GNDw. In some cases, the wafer capacitors and inductors, such as shown by their CLC network under resistor Rw, represent the electrical characteristics of an interconnect such as interconnect 155 and/or 255. Here, the CLC network may represent an interconnect between the chiplet and the wafer. These characteristics may be part of what is being tuned and/or be part of the interconnection tuning circuitry on the chiplet and/or wafer. The resistor Rw might be considered a separate interconnection tuning circuit on the wafer 110. The wafer capacitors, inductors and resistors may be tuning circuitry for matching of impedances of the interconnects from the chiplet. The wafer circuitry may be described as passive (e.g., R, C, L, non-transistor) devices for the purpose of one of tuning or matching networks. Other passive devices may be in or on the wafer. In some cases, the wafer 110 only includes passive, non-transistor devices. In other cases, the wafer circuitry may also include active devices that are not radio frequencies (RF) transistor devices.

Chiplet 130 includes resistors R1, R2 and R3; capacitors C1 and C2; inductor L1, Transistors T1 and T2. Transistor T1 has source S1, drain D1 which is considered the transistor output OUT1 and gate G1 which is considered the transistor input IN1. Transistor T2 has source S2, drain D2 which is considered the transistor output OUT2 and gate G2 which is considered the transistor input IN2. The chiplet circuitry may be described as having both passive (e.g., R, C, L) and active (e.g., at least transistors T1 and T2) devices. Other passive and/or active devices may be in or on the chiplet.

In some cases, an input signal to the transistor T1 and/or transistor T2; or an input signal to the chiplet such as input INx (e.g., where x is a number as indicated herein); or another input signal to the chiplet also includes a second ground signal, such as GNDr1 or GNDr2 or another ground signal from the chiplet to the transistor or wafer 110.

A differential input port between G1/IN1 and G2/IN2; and a differential output port between D1/OUT1 and D2/OUT2 may be used to increase the power generated in a given chiplet area. In this case, S22 may be the "reflection" of output power when Port 2 or OUT2 is connected to a load (not shown). In some cases, an output signal from the transistor T1 and/or transistor T2; or an output signal from the chiplet such as input OUTx (g., where x is a number as indicated herein); or another output signal from the chiplet also includes a second ground signal, such as GNDr1 or GNDr2 or another ground signal to the chiplet or from the transistor or wafer 110. Here, an input to a transistor or chiplet may have a port 1 between the gate of the transistor and GNDr1; and have an output from the transistor between the drain of the transistor and GNDr1. The input port 1 may have a reflection of input power from a source that is characterized by S11; the output port 2 may have a reflection of output power at the load (e.g., LD1) that is characterized by S22; a forward propagation (gain) of the wave from port 1 to port 2 that is S21; and a reverse propagation (isolation) of the wave from port 2 to port 1 that is S12.

The available gain GA of the S-parameter network may be characterized by S parameters and the source impedance as:

$$G_A = \frac{|S_{21}|^2(1-|\Gamma_S|^2)}{|1-S_{11}\Gamma_S|^2 - |S_{22} - \Delta\Gamma_S|^2}$$

The unilateral gain U may be invariant to a lossless embedding network of any of the networks 140 as:

$$U = \frac{|S_{12} - S_{21}|^2}{\det[1 - SS*]}.$$

These S-parameters are useful for characterizing how stable a circuit is. A family of stability circles exists over all frequency and input powers. The circuit is only unconditionally stable if the mu u factor remains greater than 1 for all stability circles possible operating conditions, such as where:

$$\mu = \frac{1 - |S_{11}|^2}{|S_{22} - \Delta S_{11}^*| + |S_{12}S_{21}|} > 1.$$

That is any of the networks 140, without circuitry of the wafer 110 (except with the network of FIG. 2C of inductors L3-L8 on the wafer) may make the transistor or chiplet unconditionally stable by causing u to be greater than 1 under operating conditions, such as when the transistor or chiplet is amplifying or passing an RF signal.

Each of transistors T1 and T2 may be a radio frequencies (RF) transistor device. Each of transistors T1 and T2 may operate at (e.g., amplify, pass and/or switch) radio frequencies and/or be an RF wave transistor device. Each may operate on electronic signals with frequencies between 10 MHz and 300 GHz, 30 GHz and 300 GHz or 10 MHz and 10 GHz. Each of transistors T1 and T2 may be a millimeter-wave or a microwave transistor device. Each of transistors T1 and T2 may be a single ended RF amplifier, such as used to make a chain of amplifiers, a receiver using amplifiers, a mixer, a switch or a frequency multiplier. Each of transistors T1 and T2 may be part of a differential amplifier, placed in parallel with a shared drain and source but distinct gate or base connections for a frequency multiplier, or in a series connection of devices for a cascode. Additionally, transistors T1 and/or T2 might be part of a switch pair of transistors for an RF switch or mixer. Four total transistors might be used in a single chiplet for a FET ring mixer. Each of transistors T1 and T2 may be a heterojunction bipolar transistor (HBT), in which case they will have a base, emitter and collector instead of a gate, source an drain, respectively. Each of transistors T1 and T2 may be used in common gate mode by grounding both transistor's gates and using the sources as inputs. Each of transistors T1 and T2 may be used with the input at the source and an output at the drain.

In the example of FIG. 1C, transistor T1 is an RF amplifier and has a signal phase output of a differential amplifier, and transistor T2 is another RF amplifier and has a signal phase output of the differential amplifier that is 180 degrees out of phase with the signal phase of transistor T1. Transistors T1 and T2 may be two differential RF transistors and there may be interconnects from these transistors to contact pads 138 on a frontside surface of the chiplet 130.

Wafer 110 may also include circuit networks to provide a virtual ground at GNDr1 such as an AC ground and circuitry to apply the DC bias voltage applied to the node N1 between resistors R1 and R2. Wafer 110 may also include GNDr2 such as an AC ground and DC bias voltage applied to one end of resistor R3 that is opposite the node N1 between resistors R1 and R2.

Assembly 106 also includes interconnects 155 between contacts 118 of wafer 110 and contacts 138 of chiplet 130. A contact may be a contact pad or other electrical connection to circuitry of the wafer or chiplet. The interconnect 155 may be a trace (e.g., of a PCB), a wire or another electrically conductive connection between the contacts. The electrical interconnects 155 electrically connect the wafer circuitry to the chiplet circuitry. There may be similar interconnects and contact pair at the border (e.g., at sidewalls) between the wafer and chiplet for each electrical connection needed at that border.

The electrical interconnects 155 electrically connect the circuit devices of the wafer and the transistors of the chiplets. The interconnect between the chiplet and wafer may be mistuned, such as by having mismatches in stability, AC signal, DC signal, impedance, frequency and/or other electronic signal matching with the input and/or output to the chiplet or a transistor on the chiplet. This lack of tuning may be improved or tuned using the tuning circuits 140. Notably, the interconnection tuning circuits 140 reduce this electrical mistuning of passive devices and the transistors caused by the electrical interconnects that may impact circuit performance and reduces the uncertainty of the electrical impedance and frequency of signals passed across the interconnects to improve the circuit performance.

The interconnection tuning circuits 140 may be any or all of the resistors, inductors and capacitors shown on the chiplet 130 or other chiplets herein. In some cases, it may also include inductors on the wafer such as shown in FIG. 2C. The interconnection tuning circuits 140 may include at least one of a stabilization network (e.g., network of electronic circuitry), a gain boosting network, a power delivery network, and/or a low-noise network. Each of these networks may be an embedded network that is embedded into wafer 110 as part of the chiplet.

There may be more or fewer electrical and/or circuit components than shown in FIG. 1C for chiplet 130, wafer 110, and/or interconnection tuning circuits 140. Although only one is shown in FIG. 1C, there may be multiple chiplets 130 in cavities of wafer 110. There may be between 10 and 1000 such chiplets in the wafer.

Figure 2A:
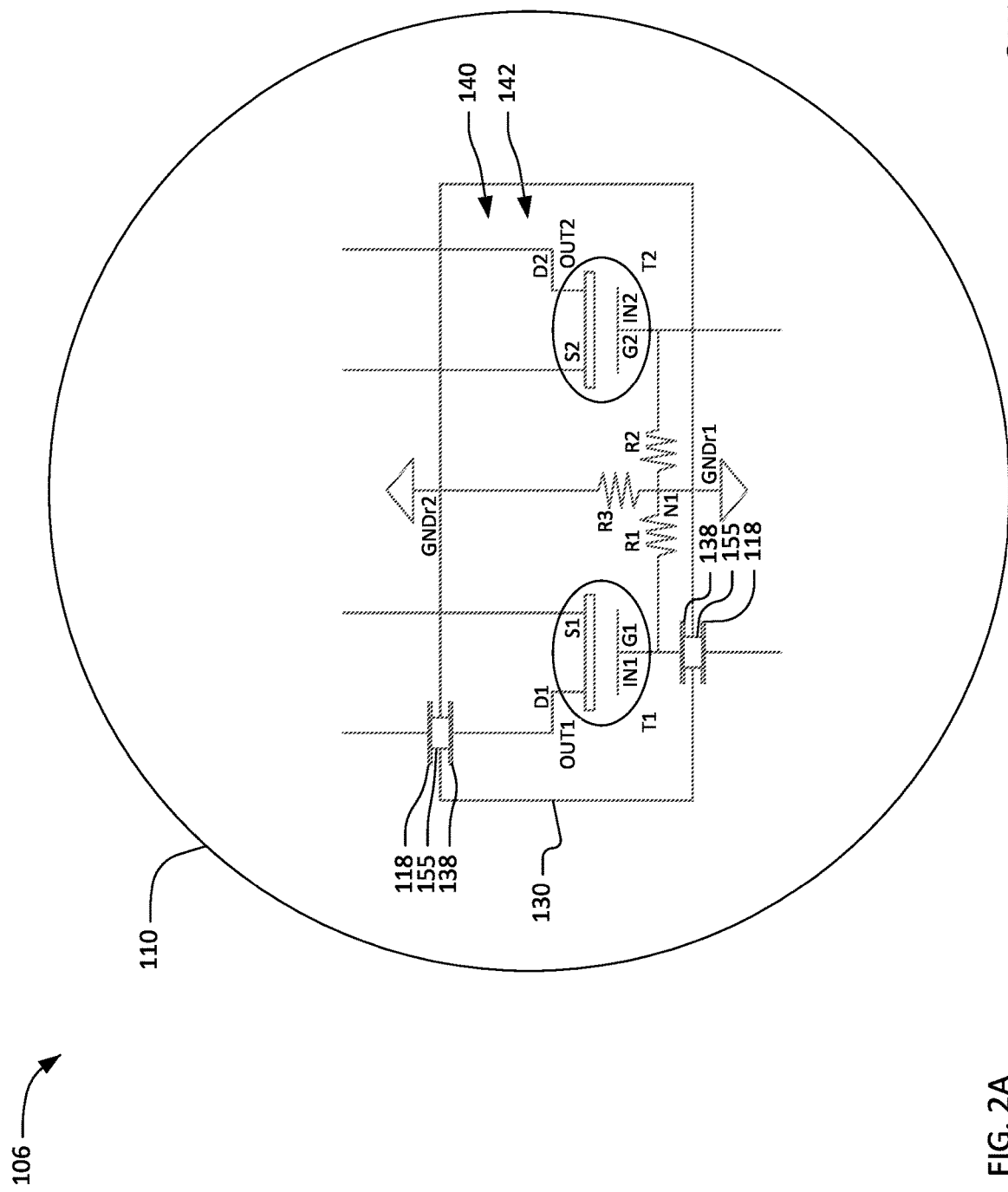
FIG. 2A is a schematic diagram of the electronic assembly of FIG. 1C that isolates an example of interconnection tuning circuits having stabilization network circuitry.

FIG. 2A is a schematic diagram of the electronic assembly 106 of FIG. 1C that isolates an example of stabilization network circuitry 142 of the interconnection tuning circuits 140. Circuitry 142 may be a network of electronic circuitry having passive circuitry that includes at least one of resistors R1, R2 and/or R3. Circuitry 142 may include only resistors R1 and R2. In another case, circuitry 142 includes all of resistors R1, R2 and R3. The R3 resistor is introduced to provide common-mode stability or to provide feedback to the virtual ground on the drain/output circuitry. Circuitry 142 may optionally include ground GNDr1 and/or GNDr2. Circuitry 142 may optionally include one or more of inductor L1, capacitor C1 and/or capacitor C2. The stabilization network circuitry 142 may be stabilization network circuit for transistor T1 and/or T2 in spite of the electrical characteristic or mistuning of interconnection circuit 155 and/or 255. Additionally, the resistor R3 may not grounded to GNDr1 but may instead connect to the drain D1 and/or D2 of the transistor T1 and/or T2 through some external circuit that exists in the wafer. In some cases, resistors R1, R2 and R3 are not grounded to ground GNDr1 or GNDr2 (although they may be grounded to a "virtual" ground), and are used to provide a DC bias to the gates G1 and G2 while not influencing the differential circuit's RF frequency performance. The ground GNDr1 or GNDr2 may provide DC bias voltage through resistors R1 R2 and R3 to the gates G1 and G2. Thus, the resistors R1 R2 and R3 provide stabilization of the DC bias to the gates G1 and G2, such as by setting the DC bias on the gates of the transistors.

In some cases, circuitry 142 may include at least one resistor R1 between the input IN1 of transistor T1 and the node N1 to ground GNDr1; at least one resistor R2 between the input IN2 of transistor T2 and the node N1; and at least one resistor R3 between the node N1 and ground GNDr2. Here, ground GNDr1 may be a first AC ground that allows a DC voltage that provides a desired first DC bias to the inputs IN1 and IN2; and GNDr2 may be a second AC ground and DC voltage that provides a desired second DC bias to the inputs the inputs IN1 and IN2.

In some cases, circuitry 142 may include at least one resistor R1 (and optionally R2) between the input IN1 and the input IN2; and at least one resistor R2 (and optionally R1) between the input IN2 and the input IN1, as shown in FIG. 1C. There may optionally be capacitors C1 and C2 between these inputs and outputs as shown in FIG. 1C. There may optionally be inductor L1 between the S1 and S2 as shown in FIG. 1C.

Any one, two or all 3 of these resistors R1, R2 and R3 may provide desired DC bias and common mode stability to the inputs IN1 and IN2 as compared to without the resistor(s). Any one, two or all 3 of these resistors R1, R2 and R3 may provide desired impedance matching at the input and output of each transistor T1 and T2 as compared to without the resistor(s).

In some cases, these resistors R1 and R2 may provide desired differential mode (e.g., where the operation or output of transistor T2 is 180 degrees out of phase with transistor T1) stability to the inputs IN1 and IN2 as compared to without those resistors; and may provide desired impedance matching at the input and output of each transistor T1 and T2 as compared to without those resistors. This stability with reduce unwanted changes in power levels, output of noise and/or oscillation of the transistor outputs. Here, resistors R1 and R2 may provide desired shunt resistance to ground (e.g., GNDr1) that is used for the stabilization.

In some cases, the resistor R3 (and optionally a capacitor such as C1 in series with resistor R3) may provide desired common mode (e.g., where the operation or output of transistor T2 is 0 degrees out of or in phase with transistor T1) stability to the inputs IN1 and IN2 as compared to without those resistors; and may provide desired common mode impedance matching at the input and output of each transistor T1 and T2 as compared to without those resistors.

This stability with reduce unwanted changes in power levels, output of noise and/or oscillation of the transistor outputs. Here, resistor R3 may provide desired series feedback (e.g., to components of the chiplet or wafer electrically connected to the transistor output) that is used for the common mode stabilization.

The DC stability and/or impedance matching produces an unconditionally stable chiplet with respect to signal received on the interconnects 155 from the wafer and thus allows the active device transistors T1 and T2 of chiplet 130 to also be unconditionally stable. It is considered that stabilization of the transistors T1 and T2 might incorporate lossy components such as resistors R1, R2 and R3 and reactive components such as capacitors C1 and C2 and inductor L1 to stabilize the transistors T1 and T2 in a specific frequency band of operation as noted for the transistors. The stabilization can be applied to a single transistor but also to a differential pair example of transistors T1 and T2. In this case, both the stability of the differential and common-modes would be guaranteed through the network circuitry 142 implemented on the active chiplet.

Figure 2B:
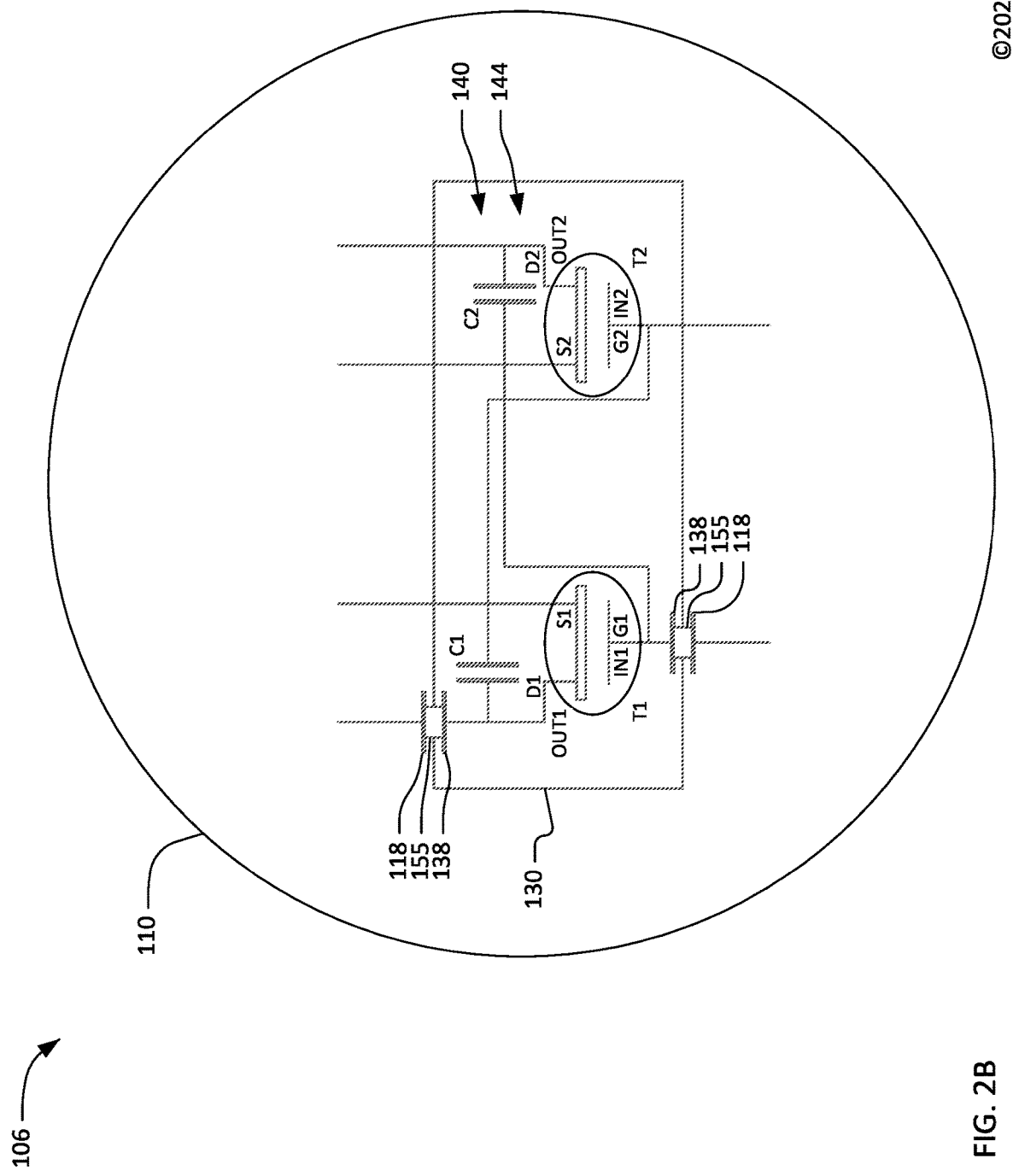
FIG. 2B is a schematic diagram of the electronic assembly of FIG. 1C that isolates an example of interconnection tuning circuits having a neutralization network to improve stability or introduce positive feedback to increase gain of the transistor in the presence of the interconnection to the wafer.
Figure 2C:
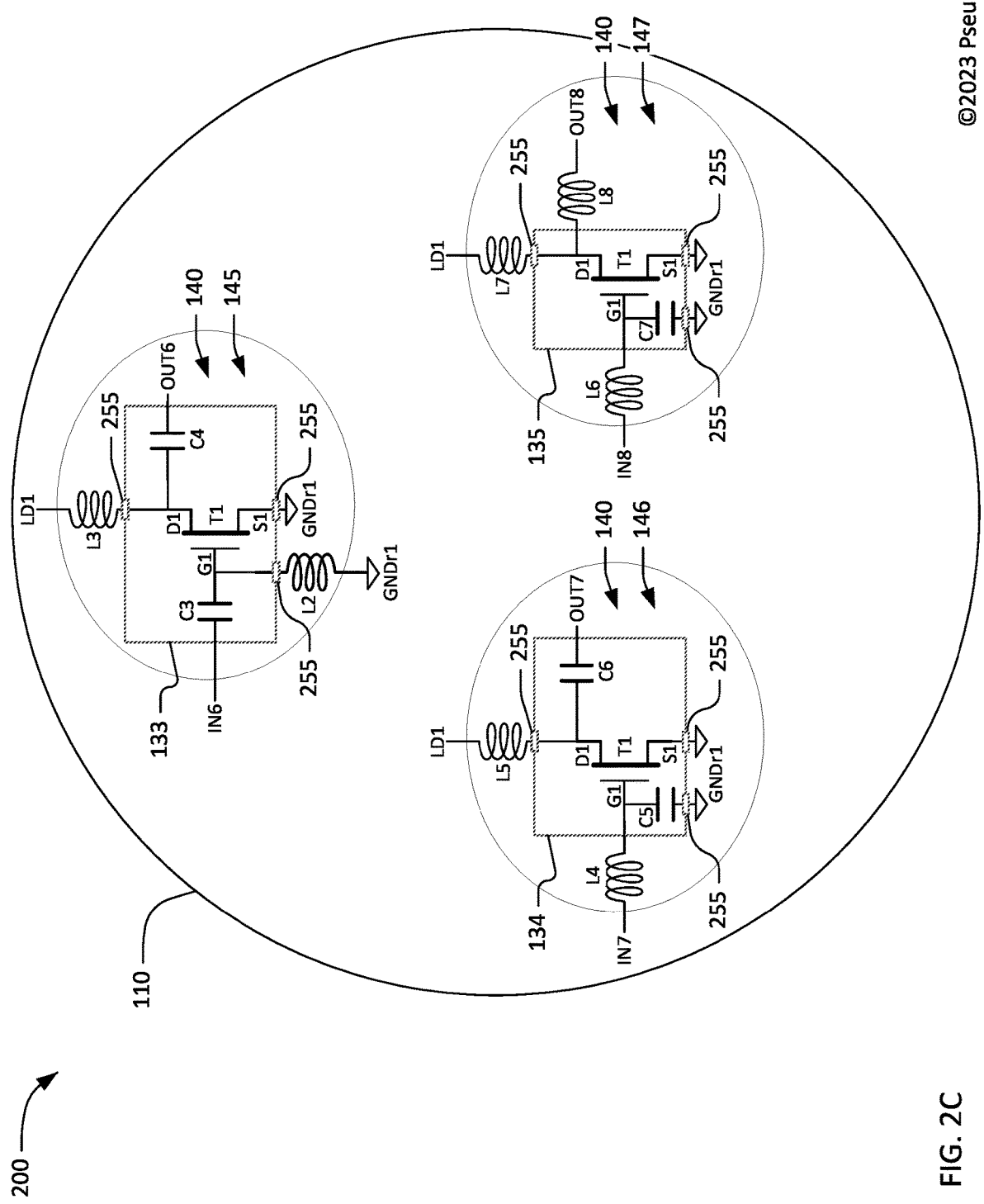
FIG. 2C is a schematic diagram of an electronic assembly that isolates an example of power delivery to and from chiplets through the interconnection tuning circuits that introduce impedance matching.

FIG. 2B is a schematic diagram of the electronic assembly 106 of FIG. 1C that isolates an example of gain boosting network circuitry 144 of the interconnection tuning circuits 140. Circuitry 144 may be a network of electronic circuitry having passive circuitry that includes at least one of capacitors C1 and/or C2. Circuitry 144 may include both of capacitors C1 and C2. Circuitry 144 may optionally include ground GNDr1 and/or GNDr2. Circuitry 142 may optionally include one or more of resistors R1, R2 and/or R3, such as shown in FIG. 1C. Circuitry 144 may be a neutralization network to improve stability of transistor T1 and/or T2; or to introduce positive feedback to transistor T1 and/or T2 to increase gain of the transistors in the presence of or through the interconnections 155 and/or 255 to the wafer.

In some cases, circuitry 144 may include at least one capacitor C1 between the input IN2 of transistor T2 and the output OUT of transistor T1; and at least one capacitor C2 between the input IN1 of transistor T1 and the output OUT2 of transistor T2. These capacitors counter-act the parasitic gate-drain capacitance of transistors T1 and T2.

In some cases, circuitry 144 may include at least one resistor R1 and R2 between the input IN1 and input IN2 as shown in FIG. 1C. There may optionally be inductor L1 between the S1 and S2 as shown in FIG. 1C.

Both of these capacitors C1 and C2 may provide desired gain boosting and/or a "neutralization"—such as electrically isolating the input IN from the output OUT of each transistor T1 and T2 of the chiplet as compared to without the capacitor(s). Any one or both of these capacitors C1 and C2 may provide desired impedance matching of the impedance the transistor sees at its input IN and output OUT from the wafer 110 as compared to without the capacitor(s). In some cases, the network circuit 144 implemented on the active chiplet 130 can realize desired specific optimization for gain of the transistors T1 and T2. For instance, both of these capacitors C1 and C2 may provide desired unilateralization to improve the gain of the transistor(s) by eliminating the reverse signal flow of the transistor(s) (e.g., cause S12=0) as compared to without the capacitor(s). In other words, each of transistors T1 and T2 can be unilateralized such that the reverse isolation (S12—backwards transfer function from OUT to IN) is zero. Any one or both of these cross-coupled capacitors C1 and C2 may provide a desired negative capacitance to cancel Cgd (the capacitance between the gate and drain) of the transistor(s) as compared to without the capacitor(s). When operating in differential mode, where transistor T2 is 180 degrees out of phase with transistor T1, the cross coupled capacitors C1 and C2 act as a negative capacitor to the transistors T1 and T2, thus canceling the Cgd of each respective transistor as compared to without the capacitors. Another gain boosting technique or circuit (not shown) can be used to increase the gain beyond the unilateral gain. The limit of either or both of these gain boostings, while remaining unconditionally stable, is to reach 4 U (e.g., 4× the maximum unilateral gain of the T1 and T2).

In other embodiments, any one or both of these capacitors C1 and C2 may be replaced with an inductor such as an inductor as noted herein between the gate of one of transistor T1 and T2 and the drain of the other one of one of transistor T1 and T2.

FIG. 2C is a schematic top view of an electronic assembly 200 that isolates an example of power delivery circuits 145, 146 and 147 of the interconnection tuning circuits 140 having passive circuitry of chiplets 133, 134 and 135, each having active transistor T1. In some cases, one of power delivery and efficiency circuits 145, 146 or 147 is also on the chiplet having active transistor T2, such as where chiplets 133, 134 and 135 have both transistor T1 as shown in FIG. 2C and also have transistor T2 (e.g., see assembly 106) with one of circuits 133, 134 or 135. Each of circuits 145, 146 and 147 may be an example of a power delivery circuit to and from chiplets 133, 134 and 135 through the interconnection networks including through interconnections 155 and/or 255 that introduce impedance matching through interconnections 155 and/or 255, such as from the wafer to transistor T1.

There may be more or fewer electrical and/or circuit components than shown in for chiplets 133, 134 and 135, wafer 110, and/or network circuits 133, 134 or 135. The circuitry of chiplets 133, 134 and 135 may be described as having both passive (e.g., R, C, L) and active (e.g., at least transistor T1) devices. Other passive and/or active devices may be in or on the chiplet. Although only three chiplets are shown, there may be numerous chiplets in cavities of wafer 110. There may be between 10 and 1000 such chiplets in the wafer.

Each of chiplets 133, 134 and 135 may represent a version of chiplet 130. Each of circuits 145, 146 or 147 may represent a version of circuitry 140.

Interconnects 255 are examples of interconnects such as those described by contact 118, interconnect 155 and contact 138. The electrical interconnects 255 electrically connect the wafer circuitry to the chiplet circuitry. There may be interconnects similar to interconnects 255 at the border (e.g., at sidewalls) between the wafer and chiplet for each electrical connection needed at that border.

In some cases, circuitry 145, 146 or 147 may include at least one capacitor C5 or C7 between the gate G1 of transistor T1 and the ground GNDr1; and/or at least one capacitor C4 or C6 between the drain D1 of transistor T1 and the output OUT6 or OUT 7 of chiplets 133 and 134.

Circuitry 145 may be a network of electronic circuitry that includes at least two capacitors C3 and C4 and two inductors L2 and L3. Inductor L2 is connected between gate G1 and ground GNDr1 and/or other active or passive circuitry of the wafer 110. Inductor L3 is connected between the load LD1 and the node between drain D1 and capacitor C4. Capacitor C3 is connected between the input IN6 and the node between the inductor L2 and gate G1. Capacitor C4 is connected between the drain D1 and the output OUT6. Inductor L2 may be used to provide DC bias to gate G1 and inductor L3 may be used to provide DC bias to drain D1. Capacitors C3 and C4 may be used to isolate the transistor from another part of the circuit and/or prevent DC current from flowing into a termination port.

Load LD1 may be a 50-Ohm load which is a convention used in the definition of S-parameters that describe power flow into and out of a transistor.

In the case shown, inductors L2 and L3 are on wafer 110, such as due to their larger size than the capacitors. In other cases, inductors L2 and L3 are on chiplet 133.

Inductors L2 and L3; and capacitors C3 and C4 may create an electrical network that increases power delivery and efficiency for transistor T1 (e.g., at output OUT6), by transforming the impedance of the source and/or load to an impedance seen at the transistor that maximizes the power delivered or the power added efficiency, as compared to without the inductors and capacitors. As an impedance transformation network, any of circuits 145, 146 and 147, is an electrical network that takes one impedance (Z1) at one port (such as the input IN or output OUT of that circuit) and transforms it to another impedance (Z2) at a second port (such as the other of the input IN or output OUT of that circuit). For transistor T1, they may maximize output power (e.g., at output OUT6) under mismatches in the load impedance (e.g., of LD1) or introduce load modulation for power efficiency under different output power conditions, as compared to without the inductors and capacitors.

Circuitry 146 may be a network of electronic circuitry that includes at least two capacitors C5 and C6 and two inductors L4 and L5. Capacitor C5 is connected between gate G1 and ground GNDr1. Inductor L5 is connected between the load LD1 and the node between drain D1 and capacitor C6. Inductor L4 is connected between the input IN7 and the node between the capacitor C5 and gate G1. Capacitor C6 is connected between the drain D1 and the output OUT7. Inductor L4 may be used to provide DC bias to gate G1 and inductor L5 may be used to provide DC bias to drain D1. Capacitors C5 and C6 may be used to isolate the transistor from another part of the circuit and/or prevent DC current from flowing into a termination port.

In the case shown, inductors L4 and L5 are on wafer 110, such as due to their larger size than the capacitors. In other cases, inductors L4 and L5 are on chiplet 134.

Inductors L4 and L5; and capacitors C5 and C6 may provide desired increased power delivery and efficiency for transistor T1 (e.g., at output OUT7) through impedance transformations, as compared to without the inductors and capacitors. For transistor T1, they may maximize output power (e.g., at output OUT7) under mismatches in the load impedance (e.g., of LD1) or introduce load modulation for power efficiency under different output power conditions, as compared to without the inductors and capacitors.

Circuitry 147 may be a network of electronic circuitry that includes at least one capacitor C7 and three inductors L6, L7 and L8. In some cases, capacitor C7 is on the host wafer 110 and not within chiplet 135. Inductor L7 is connected between the load LD1 and the node between drain D1 and inductor L8. Inductor L6 is connected between the input IN8 and the node between the capacitor C7 and gate G1. Inductor L8 is connected between the drain D1 and the output OUT8.

In the case shown, inductors L6-8 are on wafer 110, such as due to their larger size than the capacitors. In other cases, inductors L6-8 are on chiplet 135.

Inductors L6, L7 and L8; and capacitor C7 may provide desired tuning that increases power delivery and efficiency for transistor T1 (e.g., at output OUT8) through impedance transformations, as compared to without the inductors and capacitors. For transistor T1, they may maximize output power (e.g., at output OUT8) under mismatches in the load impedance (e.g., of LD1) or introduce load modulation for power efficiency under different output power conditions, as compared to without the inductors and capacitors. By moving the inductors to the host wafer 110, substantial reduction in cost and time is achieved. In some cases, it is less expensive and results in fewer defects when the inductors are formed on the wafer 110 instead of on a chiplet because the wafer is a cheaper and easier to process semiconductor material.

Power delivery and efficiency circuits 145, 146 and 147 may also be used on either or both of transistors T1 and/or T2 as shown in FIG. 1C.

Figure 2D:
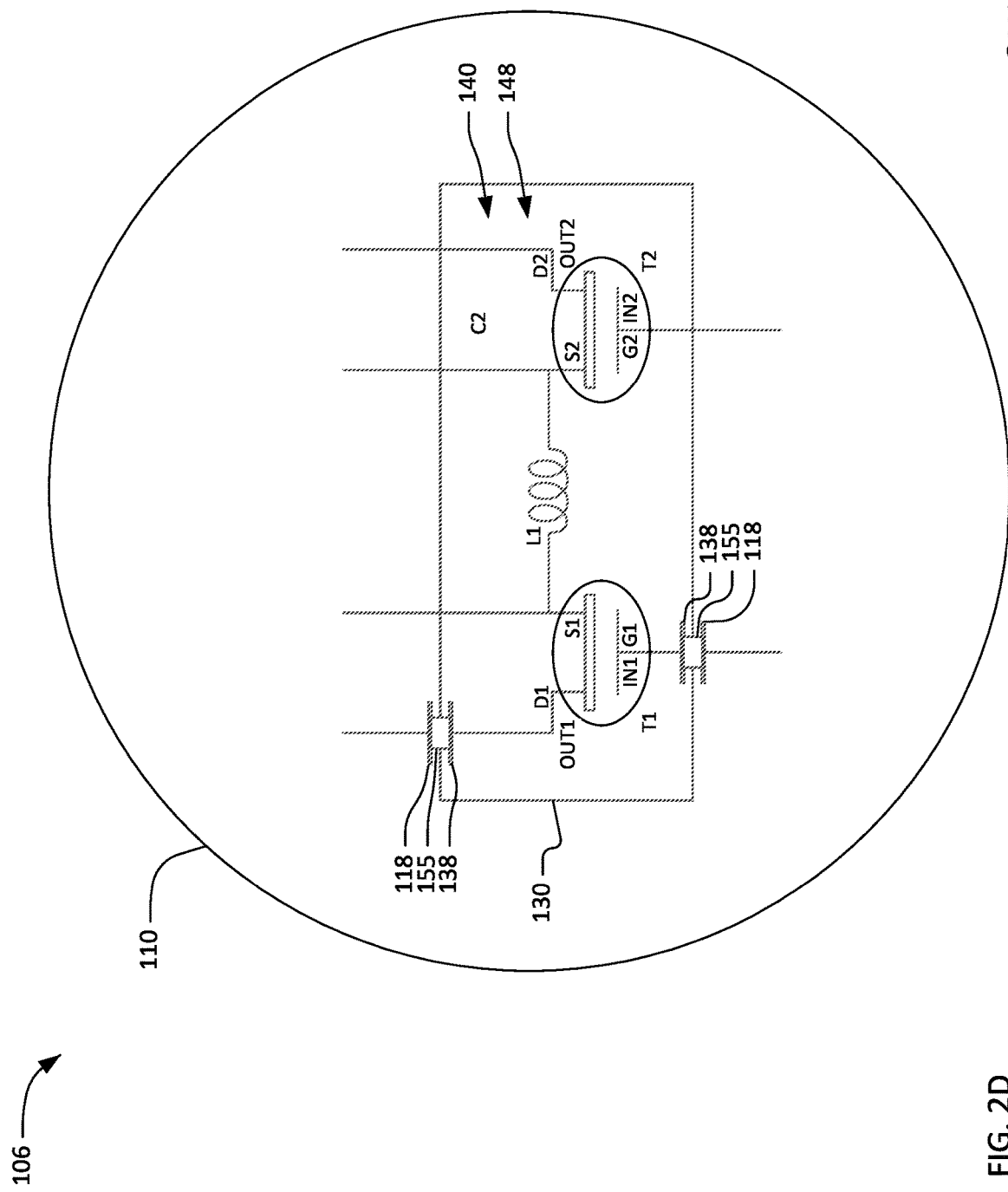
FIG. 2D is a schematic diagram of the electronic assembly of FIG. 1C that isolates an example of interconnection tuning circuits having a negative feedback or degeneration network as is found in low-noise network circuitry to tune the transistor.

FIG. 2D is a schematic top view of the electronic assembly 106 of FIG. 1C that isolates an example of low-noise network circuitry 148 of the interconnection tuning circuits 140. Circuitry 148 may be a network of electronic circuitry having passive circuitry that includes at least one inductor L1. Circuitry 148 may include only inductor L1. In another case, circuitry 148 includes all of inductor L1 and capacitor C1 and/or capacitor C2. Circuitry 148 may be an interconnection tuning circuit having negative feedback or be a degeneration network through interconnects 155 and/or 255 as is found in low-noise network circuitry to tune the transistor T1 and/or T2.

In some cases, circuitry 148 may include at least one inductor L1 between the source S1 of transistor T1 and the source S2 of transistor T2. This inductor may have a value between 5 pH and 500 pH.

In some cases, circuitry 148 may also include at least one capacitor C1 between the input IN2 of transistor T2 and the output OUT1 of transistor T1; and at least one capacitor C2 between the input IN1 of transistor T1 and the output OUT2 of transistor T2.

Inductor L1 may provide desired tuning for low-noise operation that simultaneously matches the transistor for low noise and/or gain matching Inductor L1 can act as a local "ac ground" that avoids a ground current from flowing through the interconnects. By defining a ground on 148, the interconnect will not impact the differential behavior of the circuitry.

In other embodiments, inductor L1 may be replaced with a capacitor such as an capacitor C1 the sources of transistor T1 and T2. In other embodiments, inductor L1 may be replaced with an AC ground such as ground GNDr1 or GNDr2.

In some cases, to accurately apply transistor models, the high-frequency (AC) ground of the chiplets must be established, such as by GNDr1 and/or GNDr2. Heterogeneous integration adds parasitics that change the AC ground. A key feature of the networks 140 is that they can use differential circuitry in the chiplet to establish a local ground. A reactive or resistive source connection network, such as any of the networks 140, creates a well-defined AC ground.

Figure 2E:
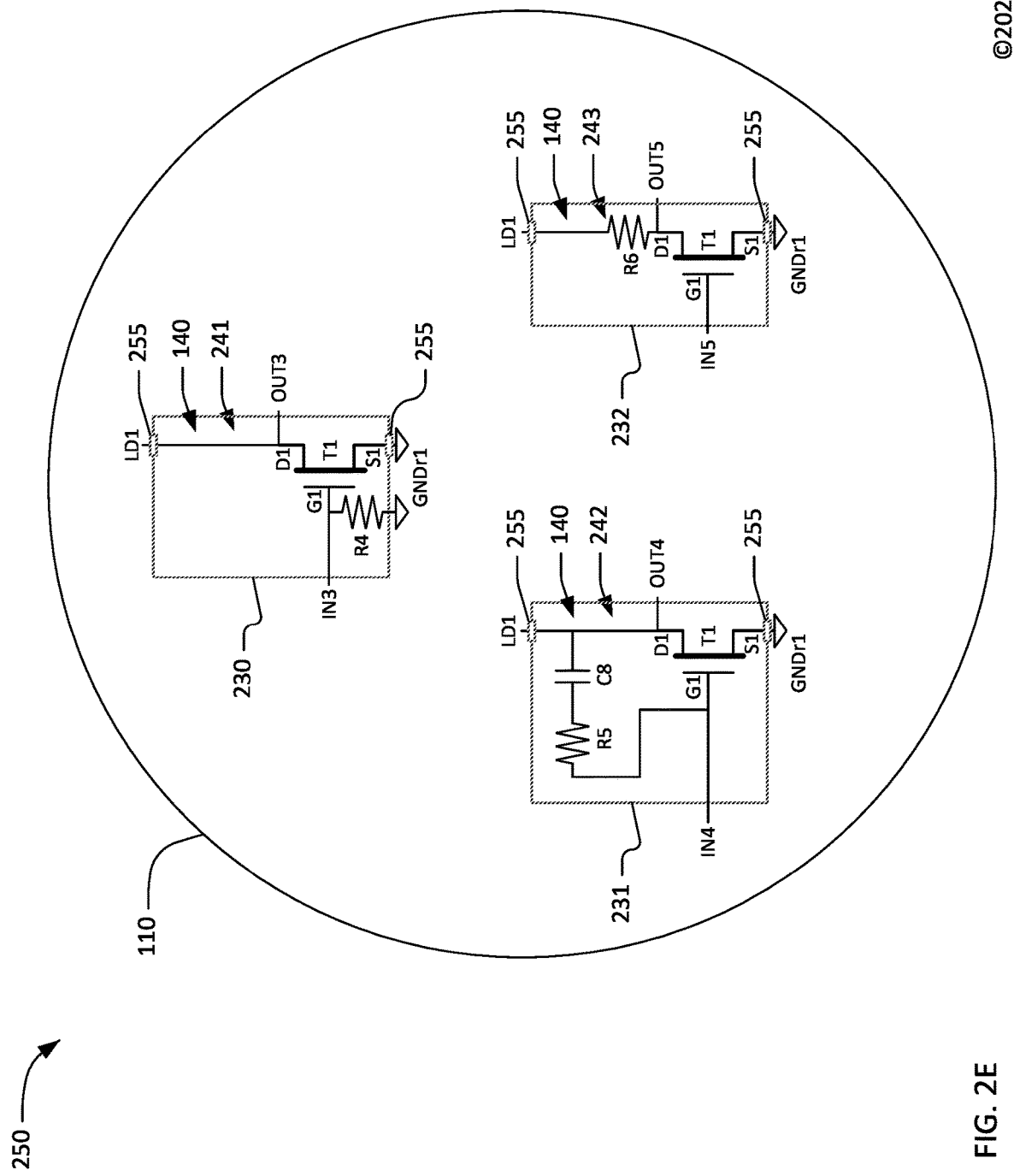
FIG. 2E is a schematic diagram of an electronic assembly that has an example of interconnection tuning circuit that isolates stabilization network circuits of the chiplets in the presence of the interconnect networks.

FIG. 2E is a schematic top view of an electronic assembly 250 that isolates an example of stabilization network circuits 241, 242 and 243 of the interconnection tuning circuits 140 having passive circuitry of chiplets 230, 231 and 232, each having active transistor T1. There may be more or fewer electrical and/or circuit components than shown in for chiplets 230, 231 and 232, wafer 110, and/or stabilization network circuits 241, 242 and 243. The circuitry of chiplets 230, 231 and 232 may be described as having both passive (e.g., R, C, L) and active (e.g., at least transistor T1) devices. Other passive and/or active devices may be in or on the chiplet. Although only three chiplets are shown, there may be numerous chiplets in cavities of wafer 110. There may be between 10 and 1000 such chiplets in the wafer. Each of circuits 241, 242 and 243 may be an isolation stabilization network circuit of chiplets 230, 231 and 232, respectively, in the presence of the interconnect networks extending through interconnects 155 and/or 255.

Each of chiplets 230, 231 and 232 may represent a version of chiplet 130. Each of circuits 241, 242 and 243 may represent a version of circuitry 140.

Circuitry 241 may be a network of electronic circuitry that includes at least one resistor R4 between gate G1 and ground GNDr1. Circuitry 241 includes input IN3 electrically attached to a node between gate G1 and resistor R3; output OUT3 at the drain D1; and a load LD1 at a node between drain D1 and output OUT3.

Resistor R4 may provide desired DC bias and DC stability to the input IN3 as compared to without the resistor. Resistor R4 may provide desired impedance matching at the input IN3 and output OUT3 of transistor T1 as compared to without the resistor.

Circuitry 242 may be a network of electronic circuitry that includes at least one resistor R5 in series with one capacitor C8 between gate G1 and output OUT4. Although the resistor is shown closer than the capacitor to the gate, the order of those components may be reversed. Circuitry 242 includes input IN4 electrically attached to a node between gate G1 and resistor R5; output OUT4 at the drain D1; and a load LD1 at a node between drain D1, an end of capacitor C8 and output OUT4.

Resistor R5 and capacitor C8 may provide stabilization over a range of frequencies between the input IN4 and/or output OUT4 as compared to without the resistor and capacitor. Resistor R5 and capacitor C8 may provide desired DC and/or AC impedance matching at the input IN4 and output OUT4 of transistor T1 as compared to without the resistor and capacitor. Resistor R5 and capacitor C8 may provide series RC feedback between the gate and drain compared to without the series RC feedback in terms of DC and/or AC biasing.

In some cases, the electrical connection between output OUT4 and the node between capacitor C5 and load LD1 may include passive or active devices.

Circuitry 243 may be a network of electronic circuitry that includes at least one resistor R6 between output OUT5 and load LD1. Circuitry 243 includes input IN5 electrically attached to gate G1; output OUT5 at a node between the drain D1 and output OUT5; and a load LD1 at the end of the resistor R6 away from the node between drain D1 and output OUT5.

Resistor R6 may provide desired DC bias and DC stability to the output OUT5 as compared to without the resistor. Resistor R6 may provide desired impedance matching at the input IN5 and output OUT5 of transistor T1 as compared to without the resistor.

The DC stability and/or impedance matching of stabilization network circuits 241, 242 and 243 produces unconditionally stable chiplets 230, 231 and 232 with respect to signals received on the interconnects 255 from the wafer 110 and thus allows the active device transistor T1 to also be unconditionally stable. It is considered that stabilization of the transistor T1 might incorporate additional lossy components such as resistors and reactive components such as capacitors and/or inductors to stabilize the transistor T1 in a specific frequency band of operation as noted for the transistors. This stabilization can be applied to a single transistor but also to a differential pair of transistors. In this case, both the stability of the differential and common-modes would be guaranteed through the network circuits 241, 242 and 243 implemented on the active chiplets 230, 231 and 232.

Stabilization network circuits 241, 242 and 243 may also be used on either or both of transistors T1 and/or T2 as shown in FIG. 1C. Any network circuitry of circuitry 140 may be an impedance matching network.

Figure 2F:
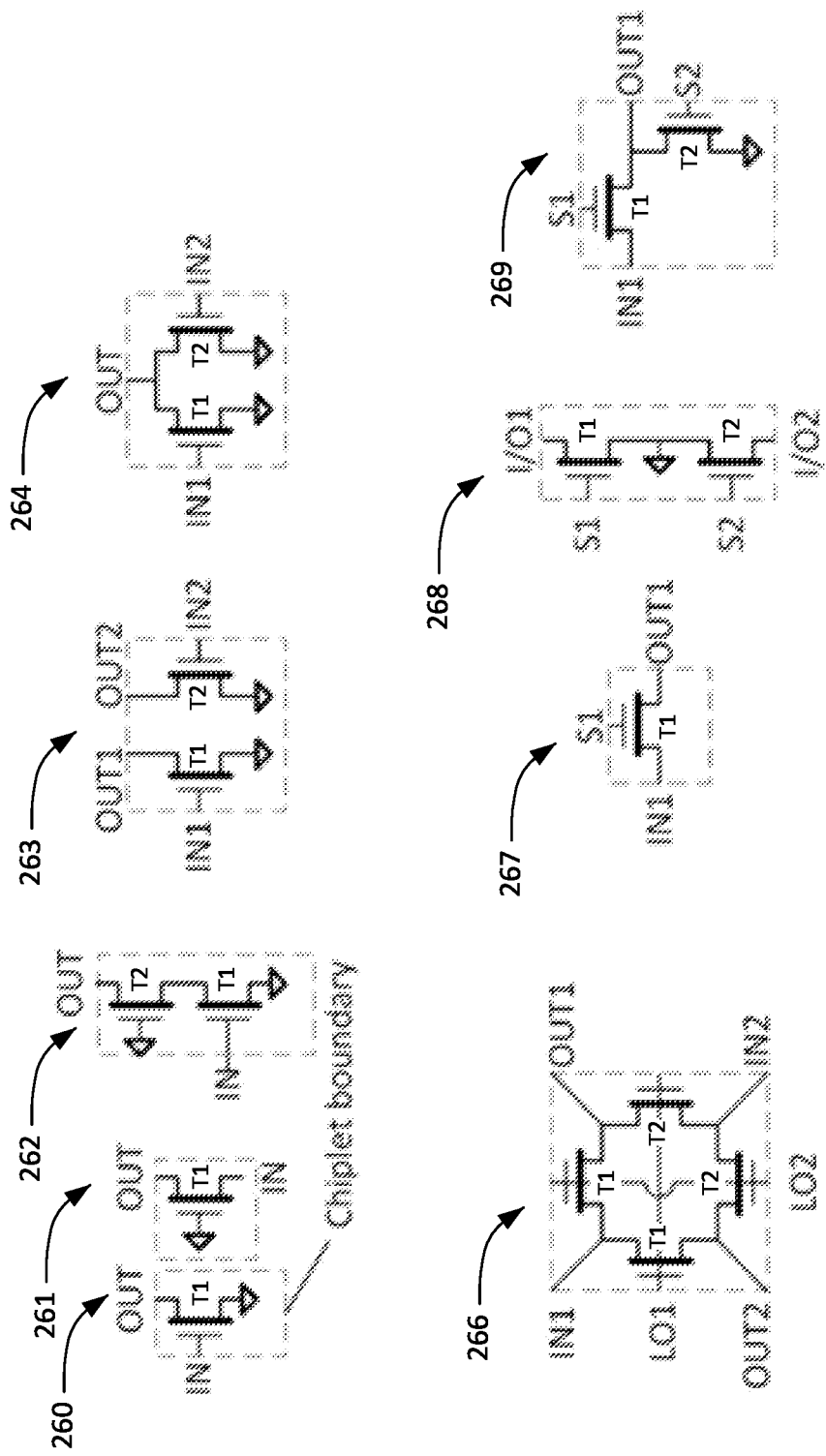
FIG. 2F shows circuits having RF transistor chiplets in a wafer, where the chiplets has interconnection tuning circuits.

FIG. 2F shows circuits 260-269 having transistor T1 and/or T2 as RF transistors; with input IN, output OUT, AC ground shown by the triangular ground symbol (which may also be a DC voltage bias), load LO; switch control signal S; and input output I/O.

FIG. 2F shows circuits 260 and 261 having transistor T1 as a single-ended RF amplifier with an input at the gate and source, respectively, and an output at the drain.

FIG. 2F also shows circuit 262 having transistors T1 and T2 in a series connection of devices for an RF cascode with an input at the gate of transistor T1, and an output at the drain of transistor T2.

Next, FIG. 2F also shows circuit 263 having both of transistors T1 and T2 as a differential RF amplifier with inputs at the gates and outputs at the drains of each transistor.

Now, FIG. 2F also shows circuit 264 having both of transistors T1 and T2 as a frequency multiplier with inputs at the gates of each transistor and an output tied to the drains of both transistors.

In addition, FIG. 2F also shows circuit 266 having two sets of transistors T1 and T2 as four total transistors on a single chiplet as an RF FET ring mixer or provider of frequency translation with two inputs IN1 and IN2; two outputs OUT1 and OUT2; and two loads LO1 and LO2.

Then, FIG. 2F also shows circuit 267 having transistor T1 as an RF switch transistor for an RF switch or mixer with an input at the source, a switch control signal S1 at the gate and an output at the drain.

Also, FIG. 2F also shows circuit 268 having transistors T1 and T2 in series as RF switch transistors for an RF switch or mixer with an input output I/O at the drain of each transistor and a switch control signal at the gate of each transistor.

Finally, FIG. 2F also shows circuit 269 having transistors T1 and T2 as part of RF switch transistors for an RF switch or mixer with an input at the source of transistor T1; an output at the drains of transistors T1 and T2; a switch control signal at the gate of each transistor.

Any of tuning circuitry 140-148 and/or 241-243, such as shown in FIGS. 1C and 2A-2E, may be applied to any of circuits 260-269. Chiplets that exhibit gain as illustrated in 260-263 require stabilization networks to ensure robust operation in the presence of interconnection to the tuning circuits. Chiplets that generate power as illustrated in 260-264 are improved in performance by tuning networks as indicated by the sample in 140-148 and/or 241-243 that produce desirable fundamental or harmonic tuning networks. Switching networks including mixers and RF switches indicate in 265-269 benefit from the network techniques in FIG. 1C to prevent signal power loss on the chiplet and, potentially, due to the interconnection networks.

FIG. 3A is a schematic cross-sectional view of a device 300 having heterogeneous integration of a radio frequencies (RF) transistor chiplets 130 into a wafer 110, where the chiplets have interconnection tuning circuits 140. Device 300 may include the one or more of the devices of any or all of FIGS. 1A-2F.

Device 300 may be an electronic assembly having an encapsulation material layer 370 having a top surface 372 and a back surface 374. Device 300 has a host wafer 110 having back surface 112 and front surface 114, with the back surface 112 of the wafer bonded to the top surface 372 of an encapsulation material layer 370 except for cavities 120 in the wafer 110 formed over a plurality of areas 376 of the top surface 372. The cavities may extend from back surface 112, through the wafer and to front surface 114. The cavities have side surfaces 116. The back surface 112 of the wafer may be directly attached to and touching the top surface 372. The bond between the back surface 112 and the top surface 372 may be a covalent, chemical or atomic bond.

Chiplets 130 have a backside 134 and a frontside 132, with the backsides 134 of the chiplets 130 bonded directly to at least portion 378 of the plurality of areas 376 of the top surface 372 of the encapsulation material layer. Portion 378 may be the footprint of the chiplet 130 on top surface 372 within the cavity 120. A gap 350 between side surfaces 116 and 136 may be the difference between area 376 and portion 378. The backside 134 may be directly attached to and touching the top surface 372. The bond between the backside 134 and the top surface 372 may be a covalent, chemical or atomic bond.

The cavities 120 may be through-substrate holes or through substrate holes etched in the wafer at the areas 376. The, chiplets 130 may be embedded into the wafer 110 at the substrate holes or at cavities 120.

A lateral material 360 extends between side surfaces 136 of the chiplets 130 and the side surfaces 116 of the wafer or cavities. The lateral material 360 may mechano-chemically bond the side surfaces 136 of the chiplets 130 to the side surfaces 116 of the wafer. The lateral material 360 may form a mechanical and/or a chemical bond to the side surfaces 136 and to the side surfaces 116. In some cases, the lateral material 360 is a molded material and the bonding is a mechano-chemical bond.

Material 360 may be a dielectric material. Material 360 may not be a metal and may be an electrical insulator. Material 360 may be or include material that is not conductive, is may not be a semiconductor, may be a plastic, may not be an alloy, may be a bio-material. Material 360 may be an epoxy. It may be an electrical insulator epoxy with electrical insulator particles. It may be epoxy with silica or $SiO_2$ particles.

In other cases, the lateral material 360 is not a dielectric material. In these cases, the lateral material 360 may be a metal, a conductor, an alloy or a semiconductor. Material 360 may be an epoxy. It may be a conductive epoxy with conductive particles. It may be epoxy with a metal particles. In these cases, there is a dielectric layer or a space (e.g., of air) between the material 360 and the interconnects 155 and/or 255.

The lateral material 360 is disposed in gaps 350 between the side surfaces 136 of each of the chiplets 130 and the side surfaces 116 of the corresponding wafer cavity that each chiplet 130 is disposed in. The gap 350 has a width gw of between 1/5 (one fifth) and 10 times a thickness tw of the wafer 110 or chiplets 130.

The thickness tw of the wafer may be between 20 and 200 microns. It may be between 50 and 125 um. It may be 75 μm. The thickness of one, many or all of the chiplets may be that same as that of the wafer.

A thickness the of the encapsulation material layer may be between 3 and 100 microns. It may be between 5 and 25 microns. It may be 15 um.

Each of the chiplets 130 have between 3 and 6 sides. They may have 4 sides. The sides may be straight, curved or wavy in profile as viewed from a top perspective. The cavities 120 may have the same number of and sides corresponding to the shapes of the sides of the chiplets 130.

The encapsulation material layer 370 may be a high-thermal-conductivity backside metallization layer that improves heat transfer from the chiplets 130 to the wafer 110. Layer 370 may be a thermal plane that improves heat conduction away from the chiplets by increasing thermal conduction from the chiplets 130 and to layer 370 and/or wafer 110. Layer 370 be a material in direct contact with the chiplets 130 to increase thermal conduction between the materials of the chiplets 130 and that of layer 370. In some cases, the encapsulation material layer 370 has a coefficient of thermal expansion between those of or equal to one of those of the wafer 110 and of the chiplets 130.

In other cases, there is no encapsulation material layer 370 and the chiplets 130 are bonded to the wafer 110 using the lateral material. the chiplets 130 may be bonded to the wafer 110 using only the lateral material.

Interconnects 155 may be formed directly on or may be formed over (e.g., formed on a dielectric or air gap over) the lateral material 360 and connect electrical (e.g., power, ground and/or signal) contacts 138 of the chiplets 130 to contacts 118 of the wafer 110. Interconnects 155 may include direct interconnect routing or traces that is formed directly on the lateral material (e.g., without any dielectric/air gap), and that extends from the chiplet contacts 138 to wafer contacts 118 and electrical routing. The interconnect routing 155 may include low loss high-performance DC, RF, and mm-wave routing from the chiplet contacts 138, directly on the lateral material 360, and to wafer contacts 118. Interconnects 155 may be directly on material 360 by being bonded to and/or directly attached to (e.g., touching) the top surface of the lateral material 360.

In some cases, wafer 110 includes an electronic integrated circuit (not shown), at least one integrated circuit contact 118 (e.g., contact pad) formed on the front wafer surface 114, and at least one through-wafer cavity 120 having side surface 116 that join back surface 112 to front surface 114. In some cases, a chiplet 130 is held in the through-wafer cavity 120 by a lateral material 360 that attaches at least one side surface 116 of the through-wafer cavity 120 to at least one side surface 136 of the chiplet 130. In some cases, lateral material 360 fills gap 350 of the cavity, thus attaching most of the side surfaces 136 of chiplet 130 to the side surfaces 116 of through-wafer cavity 120; however material 360 does not attach the backside 134 of chiplet 130 to top surface 372 of layer 370.

A passivation layer (not shown) can be arranged on most of the front surface 114 of wafer 110. Conducting vias (e.g., TWVs) arranged through the passivation layer can connect the active and/or passive circuitry of wafer 110 to contacts 118 (e.g., contact pads) on front surface 114. Wafer 110 can be a silicon wafer or substrate, which allows taking advantage of known fabrication processes and manufacturability on large wafer diameters.

It is noted that wafer 110 can include any integrated circuit, active or passive, made possible by a chosen manufacturing process; for example, a CMOS manufacturing process. In some cases, the thickness of the one or more integrated circuit layers can for example be only a fraction of the thickness tw of wafer 110 (for example between 1/10 and 1/1000 of the thickness of wafer 110; for example 50 nm thick with a wafer 50 μm thick). In some cases, the thickness of wafer 110 can be reduced after fabrication of integrated circuits of the wafer and for example before etching the through-wafer cavity 120 or after filling gap 350 with lateral material 360.

Chiplet 130 may include one or more transistors having its terminals connected to at least one integrated circuit contact 138 (e.g., contact pad), such as by a conductive via (not shown). Chiplet 130 can comprise a substrate and integrated circuit layers formed on top of its substrate, the thickness of the integrated circuit layers being for example only a fraction of the thickness of the substrate (for example between $1/10$ and $1/1000$ of the thickness of the substrate). In some cases, the total thickness of chiplet 130 is smaller than the total thickness of host wafer 110. In some cases, lateral material 360 contacts the side surfaces 136 of chiplet 130 along most of their height (at least 50% of the height, starting from close to the top surface of chiplet 130). Preferably, lateral material 360 contacts essentially all of the side surfaces 136 of chiplet 130. Preferably, lateral material 360 fills completely gap 350, up to a level essentially flush with the front surface 114 of host wafer 110.

In some cases, lateral material 360 and/or layer 370 holds the chiplet 130 such that the chiplet frontside 132 is flush with the front surface 114. Being "flush" may be understood as meaning that the two surfaces are in a same plane, or have, with respect to each other, a small or negligible height difference. The two surfaces may be flush, such as resulting from the process of permanently attaching chiplet 130 to the side surfaces 116 of through wafer cavity 120 while both the chiplet frontside 132 and the front surface 114 are attached temporarily to an adhesive laminate 340. The two surfaces may be flush, such as resulting from polishing or CMP of those surfaces after removing the temporarily to an adhesive laminate 340.

It is considered that the host wafer 110 can be vertically diced at dicing lines (shown by the vertical bars in FIGS. 3A and 3B) along a perimeter 386 of the wafer around at least one chiplet to form a chip having the at least one chiplet and an area of the wafer surrounding the at least one chiplet.

FIGS. 3A and 3B may show how the interconnect structures 155 and 255 may sit directly on top of and touch the lateral material 360 or other dielectric material between the chiplets 130 and wafer 110. The electrical interconnects electrically connect the passive devices of the wafer and the transistors of the chiplets. The interconnect between the chiplet and wafer may mistune the transistor, such as by introducing reactive mismatches in stability, AC signal, DC signal, impedance, frequency and/or other electronic signal matching with the input and/or output to the chiplet or a transistor on the chiplet. To avoid this mistuning, networks on the chiplet produced a robust characteristic. A benefit of any one or more of the interconnection tuning circuits 140 is that it reduces this electrical mistuning of passive devices and the transistors caused by the electrical interconnects that may impact circuit performance and reduces the uncertainty of the electrical interconnects to improve the circuit performance.

Also, chiplets 130 are preferably pre-tested to verify their functionality and/or performance. As a result, the yield of the final device 300 or diced devices is much improved over integration of component chips, in which the functionality of the component chips is not verified until after integration.

Advantageously, by allowing different electrical component chiplets 130 to be manufactured separately from each other and from wafer 110, electronic components of those in chiplets 130 and wafer 110 can be tested separately before assembling them. In case one of the components of a certain electrical component chiplet 130 or of wafer 110 has poor fabrication yields, it is possible to replace the component to improve the fabrication yield of the assembled electrical component to produce a completed product device 300 or die thereof, having the chiplets 130 together in the cavities of the wafer 110. For example, If an electrical component of a certain chiplet type of the chiplets 130 has poor fabrication yield, it can be rejected and replaced with a different chiplet to improve the fabrication yield of that electrical component chiplet type without spending time and money to remake the entire assembly of wafer 110, to produce a completed product device 300 or die thereof, having the chiplets 130 and wafer 110.

Further, because embodiments allow fabricating different electrical component ones of chiplets 130 separately from each other and from wafer 110, all of the component types of chiplets 130 and wafer 110 do not need to be exposed to steps in the fabrication of all the different electrical component ones of chiplets 130 that could potentially damage other ones of chiplets 130 or damage wafer 110.

Thus, embodiments can reduce manufacturing costs by using small component chips in chiplets 130 having specific features and made of exotic expensive materials, in combination with integrated circuits of other chiplets 130 and/or wafer 110 having more common features and made of cheaper common materials.

According to embodiments, chiplets 130 can include a GaN, InP or GaAs electrical component and can be fabricated on a substrate such as Si, SiGe, InP, GaAs, Alumina, or diamond. In some cases, electrical components or integrated circuits of host wafer 110 can comprise metal routing and passive components fabricated at the wafer scale. In some cases, interconnection 155 can be made using conductors made out of thin films, thick, plated interconnects, multi-layers, etc. The interconnections can for example be made using the back-end steps of a manufacturing process.

FIG. 3B is a schematic cross-sectional view of a device 301 having heterogeneous integration of a radio frequencies (RF) transistor chiplets 130 onto a wafer 310, where the chiplets have interconnection tuning circuits 140. Device 301 may include the one or more of the devices of any or all of FIGS. 1A-2F. As compared to wafer 110, wafer 310 does not have cavities 120, but instead has the chiplets mounted on a top surface of wafer 310.

In this embodiment, the chiplets 130 are mounted on or bonded to the top surface 114 of the wafer 310 instead of being in cavities 120. In this case, there may be no cavities for the chiplets. The interconnects 155 and 255 between the chiplets and wafer are on or above side surface 136 instead of on or above lateral material 360. However, the interconnects may have the same mistuning noted. Here, the concepts above also apply regarding existence of interconnects 155 and 255 between the chiplets and wafer, mistuning of those interconnects, the various interconnect tuning circuits 140 for those interconnects, and the issues and advantages provided by the interconnect tuning circuits, such as noted herein.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An electronic assembly for heterogeneous integration of radio frequencies (RF) transistor chiplets having interconnections to or between tuning circuits, the assembly comprising:
    a host wafer having a first circuit including passive devices for the purpose of one of tuning or matching networks;
    at least one chiplet having a second circuit including at least one RF transistor or RF switch device and passive tuning circuits for each of the at least one RF transistor or RF switch device, each passive tuning circuit including at least one of a stabilization network, a gain boosting network, a power delivery network, or a low-noise network; and
    electrical interconnects between the chiplets and the wafer, wherein the electrical interconnects electrically connect the first circuit to the second circuit, wherein:
    the stabilization network includes: a) a first resistor between a first input of the first transistors device and a biasing node, a second resistor between a second input of the second transistors device and the biasing node, wherein the node is to a first AC ground and DC voltage that provides a first DC bias to the first and second inputs; and b) a resistor between the node and a second AC ground and DC voltage that provides a second DC bias to the first and second inputs.

2. The electronic assembly of claim 1, wherein the RF transistor device operates at and is part of one of a single-ended amplifier, differential amplifier, balanced amplifier, doherty amplifier, connected through parallel devices with distinct gate or base connections for frequency multiplication, a ring of devices for frequency mixing, or multiple devices to form an RF switch.

3. The electronic assembly of claim 1, wherein the interconnects electrically connect the passive devices and the transistors, and
    wherein the passive tuning circuits reduce electrical mistuning of the transistors caused by the electrical interconnects that degrades transistor performance and increase uncertainty of the circuit operation.

4. The electronic assembly of claim 1, wherein each transistor device has a gate, a source and a drain; wherein each transistor device has an input at the gate and an output at the drain; wherein a first transistor device of each chiplet is a first RF amplifier and has a first signal phase output of a differential amplifier, wherein a second transistor device of each chiplet is a second RF amplifier and has a second signal phase output of the differential amplifier, and wherein the second signal phase is 180 degrees out of phase with the first signal phase.

5. An electronic assembly for heterogeneous integration of radio frequencies (RF) transistor chiplets having interconnections to or between tuning circuits, the assembly comprising:
    a host wafer having a first circuit including passive devices for the purpose of one of tuning or matching networks;
    at least one chiplet having a second circuit including at least one RF transistor or RF switch device and passive tuning circuits for each of the at least one RF transistor or RF switch device, each passive tuning circuit including at least one of a stabilization network, a gain boosting network, a power delivery network, or a low-noise network; and
    electrical interconnects between the chiplets and the wafer, wherein the electrical interconnects electrically connect the first circuit to the second circuit, wherein:
    the unilateralization or gain boosting network includes: a) at least one capacitor between a first input of the first transistor and a second output of the second transistor; and b) at least one capacitor between a second input of the second transistor and a first output of the first transistor.

6. The electronic assembly of claim 5, wherein the RF transistor device operates at and is part of one of a single-ended amplifier, differential amplifier, balanced amplifier, doherty amplifier, connected through parallel devices with distinct gate or base connections for frequency multiplication, a ring of devices for frequency mixing, or multiple devices to form an RF switch.

7. The electronic assembly of claim 5, wherein the interconnects electrically connect the passive devices and the transistors, and
    wherein the passive tuning circuits reduce electrical mistuning of the transistors caused by the electrical interconnects that degrades transistor performance and increase uncertainty of the circuit operation.

8. The electronic assembly of claim 5, wherein each transistor device has a gate, a source and a drain; wherein each transistor device has an input at the gate and an output at the drain; wherein a first transistor device of each chiplet is a first RF amplifier and has a first signal phase output of a differential amplifier, wherein a second transistor device of each chiplet is a second RF amplifier and has a second signal phase output of the differential amplifier, and wherein the second signal phase is 180 degrees out of phase with the first signal phase.

9. An electronic assembly for heterogeneous integration of radio frequencies (RF) transistor chiplets having interconnections to or between tuning circuits, the assembly comprising:
    a host wafer having a first circuit including passive devices for the purpose of one of tuning or matching networks;
    at least one chiplet having a second circuit including at least one RF transistor or RF switch device and passive tuning circuits for each of the at least one RF transistor or RF switch device, each passive tuning circuit including at least one of a stabilization network, a gain boosting network, a power delivery network, or a low-noise network; and
    electrical interconnects between the chiplets and the wafer, wherein the electrical interconnects electrically connect the first circuit to the second circuit, wherein:

the power delivery network includes: a) at least one capacitor between a gate of the first transistor and a first AC ground and DC voltage that provides a first DC bias to the gate of the first transistor; and b) at least one capacitor between a drain of the first transistor and an output of a first chiplet.

10. The electronic assembly of claim 9, wherein the RF transistor device operates at and is part of one of a single-ended amplifier, differential amplifier, balanced amplifier, doherty amplifier, connected through parallel devices with distinct gate or base connections for frequency multiplication, a ring of devices for frequency mixing, or multiple devices to form an RF switch.

11. The electronic assembly of claim 9, wherein the interconnects electrically connect the passive devices and the transistors, and
wherein the passive tuning circuits reduce electrical mistuning of the transistors caused by the electrical interconnects that degrades transistor performance and increase uncertainty of the circuit operation.

12. The electronic assembly of claim 9, wherein each transistor device has a gate, a source and a drain; wherein each transistor device has an input at the gate and an output at the drain; wherein a first transistor device of each chiplet is a first RF amplifier and has a first signal phase output of a differential amplifier, wherein a second transistor device of each chiplet is a second RF amplifier and has a second signal phase output of the differential amplifier, and wherein the second signal phase is 180 degrees out of phase with the first signal phase.

13. An electronic assembly for heterogeneous integration of radio frequencies (RF) transistor chiplets having interconnections to or between tuning circuits, the assembly comprising:
a host wafer having a first circuit including passive devices for the purpose of one of tuning or matching networks;
at least one chiplet having a second circuit including at least one RF transistor or RF switch device and passive tuning circuits for each of the at least one RF transistor or RF switch device, each passive tuning circuit including at least one of a stabilization network, a gain boosting network, a power delivery network, or a low-noise network; and
electrical interconnects between the chiplets and the wafer, wherein the electrical interconnects electrically connect the first circuit to the second circuit, wherein:
the low-noise network includes at least one inductor between a source of the first transistor and a source of the second transistor.

14. The electronic assembly of claim 13, wherein the RF transistor device operates at and is part of one of a single-ended amplifier, differential amplifier, balanced amplifier, doherty amplifier, connected through parallel devices with distinct gate or base connections for frequency multiplication, a ring of devices for frequency mixing, or multiple devices to form an RF switch.

15. The electronic assembly of claim 13, wherein the interconnects electrically connect the passive devices and the transistors, and
wherein the passive tuning circuits reduce electrical mistuning of the transistors caused by the electrical interconnects that degrades transistor performance and increase uncertainty of the circuit operation.

16. The electronic assembly of claim 13, wherein each transistor device has a gate, a source and a drain; wherein each transistor device has an input at the gate and an output at the drain; wherein a first transistor device of each chiplet is a first RF amplifier and has a first signal phase output of a differential amplifier, wherein a second transistor device of each chiplet is a second RF amplifier and has a second signal phase output of the differential amplifier, and wherein the second signal phase is 180 degrees out of phase with the first signal phase.

17. The electronic assembly of claim 13, wherein the wafer includes at least one of resistors, capacitors, inductors, through substrate vias, dielectric layers, metal layers; and wherein the wafer includes at least one layer of silicon (Si), silicon dioxide (SiO2), silicon carbide (SiC), quartz, or Gallium Arsenide; and wherein each chiplet includes at least two RF transistors and the interconnects from the transistors to contact pads on a frontside surface of the chiplet; and wherein each chiplet is a high-end pre-fabricated transistor chiplet.

18. The electronic assembly of claim 13,
wherein the host wafer has front and back surfaces, cavities in the wafer formed through a plurality of areas of the top surface of the host wafer, the cavities having side surfaces of the wafer;
wherein the at least one chiplet is a plurality of chiplets each having a backside and a frontside disposed in the cavities, each of the chiplets having the second circuit;
further comprising a lateral material between side surfaces of the chiplets and the cavity side surfaces of the wafer, wherein the lateral material bonds the side surfaces of the chiplets to the cavity side surfaces of the wafer; and
wherein the electrical interconnects are over the lateral material and between the chiplets and wafer.

* * * * *